(12) United States Patent
Otremba

(10) Patent No.: US 7,615,852 B2
(45) Date of Patent: Nov. 10, 2009

(54) SEMICONDUCTOR COMPONENT IN A HOUSING WITH MECHANICALLY INFORCING FLAT CONDUCTOR WEBS

(75) Inventor: Ralf Otremba, Kaufbeuren (DE)

(73) Assignee: Infineon Technologies AG, Munich (DE)

( * ) Notice: Subject to any disclaimer, the term of this patent is extended or adjusted under 35 U.S.C. 154(b) by 209 days.

(21) Appl. No.: 11/379,753

(22) Filed: Apr. 21, 2006

(65) Prior Publication Data

US 2006/0255362 A1  Nov. 16, 2006

(30) Foreign Application Priority Data

Apr. 22, 2005  (DE) ................. 10 2005 018 941

(51) Int. Cl.
   H01L 23/495  (2006.01)
   H01L 23/48   (2006.01)
   H01L 23/31   (2006.01)
   H01L 31/111  (2006.01)

(52) U.S. Cl. ................ 257/666; 257/E23.031; 257/E23.044; 257/177; 257/182; 257/692; 257/696; 257/698

(58) Field of Classification Search ......... 257/666, 257/177, 182, 692, E23.031, E23.044, 696, 257/698
   See application file for complete search history.

(56) References Cited

U.S. PATENT DOCUMENTS 6,307,272 B1   10/2001   Takahashi et al. ........... 257/787
6,476,481 B2   11/2002   Woodworth et al. ......... 257/696
6,703,703 B2*  3/2004    Grant ......................... 257/712
6,777,790 B2   8/2004    Corisis ....................... 257/676
7,208,818 B2*  4/2007    Luo et al. .................... 257/666
2001/0045627 A1  11/2001  Connah et al. .............. 257/666
2006/0151868 A1*  7/2006  Zhu et al. .................... 257/690
2007/0013059 A1*  1/2007  Otremba ..................... 257/724

FOREIGN PATENT DOCUMENTS

| DE | 199 20 381 A1 | 12/1999 |
| DE | 101 22 191 A1 | 8/2002 |
| DE | 103 03 933 A1 | 8/2004 |
| DE | 101 09 936 B3 | 2/2005 |
| DE | 10 2004 015 403 A1 | 11/2005 |
| DE | 10 2004 018 483 A1 | 11/2005 |
| WO | 2005/017994 A1 | 2/2005 |
| WO | 2005/096375 A2 | 10/2005 |
| WO | 2005/101458 A2 | 10/2005 |

OTHER PUBLICATIONS

"BUK7T2R7-30B TrenchMOS™ Standard Level FET" Rev. 01, Mar. 4, 2003 Philips Corporation, 1 page.

* cited by examiner

Primary Examiner—Alexander O Williams
(74) Attorney, Agent, or Firm—Banner & Witcoff, Ltd.

(57) ABSTRACT

The standard housing (27) of a semiconductor component (21), preferably a power semiconductor component features a plurality of external leads (1-5). Between adjacent external leads (2-3 and 4-5) for identical supply potentials or signals, mechanically reinforcing flat conductor webs (28) electrically connecting the external leads (2-3 and 4-5) are located within and/or outside the standard housing (27).

12 Claims, 7 Drawing Sheets

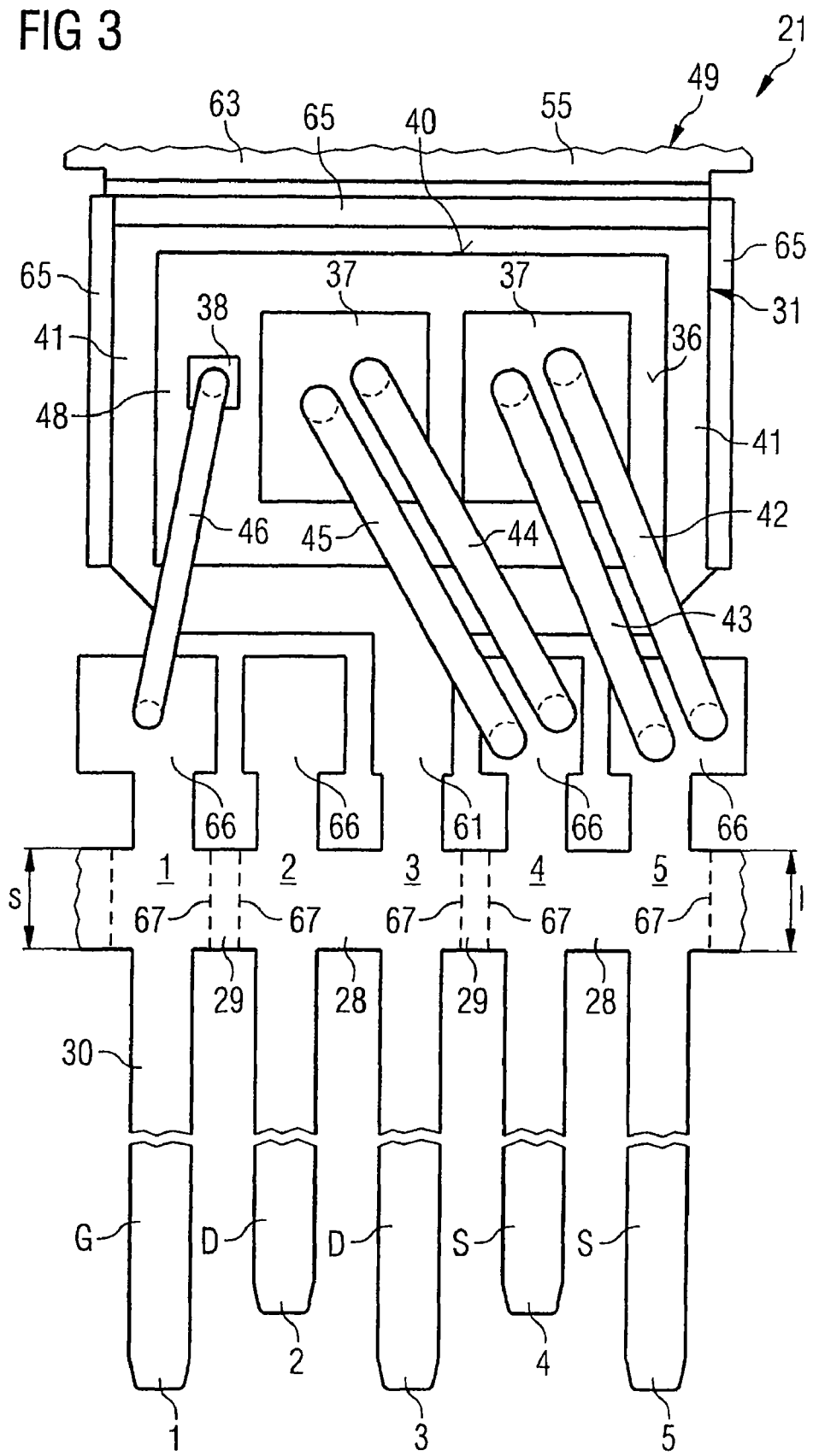

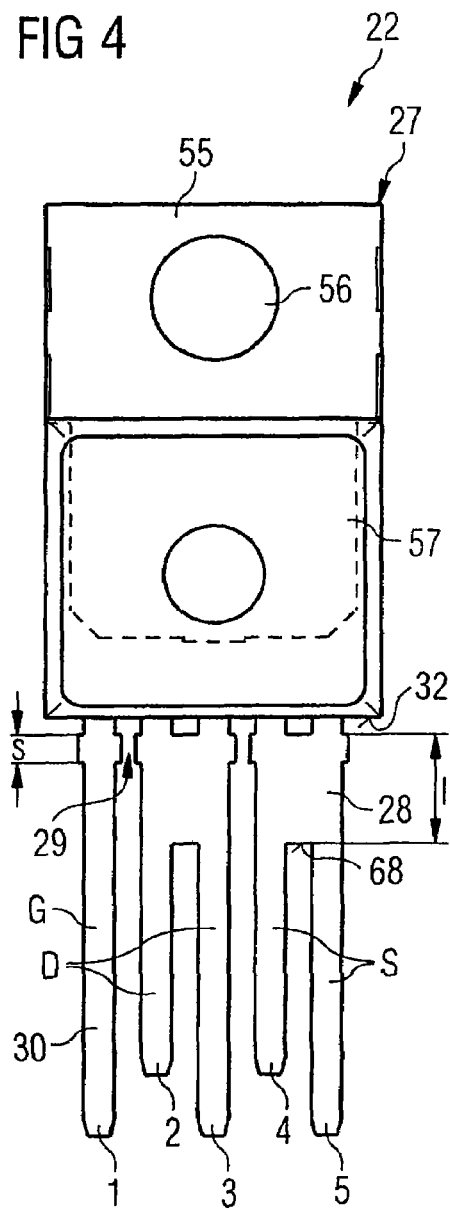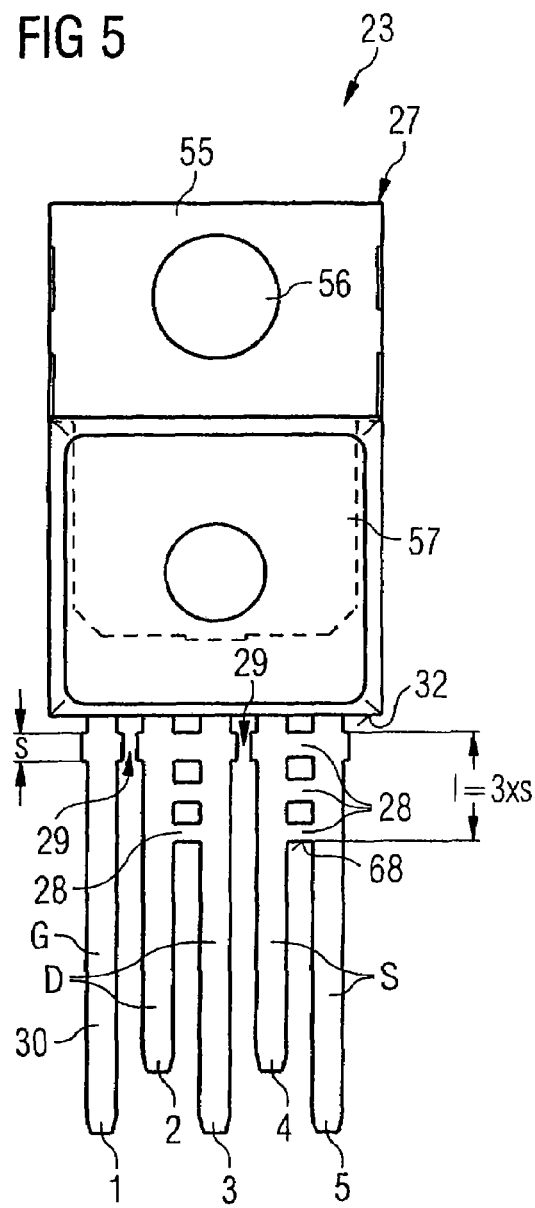

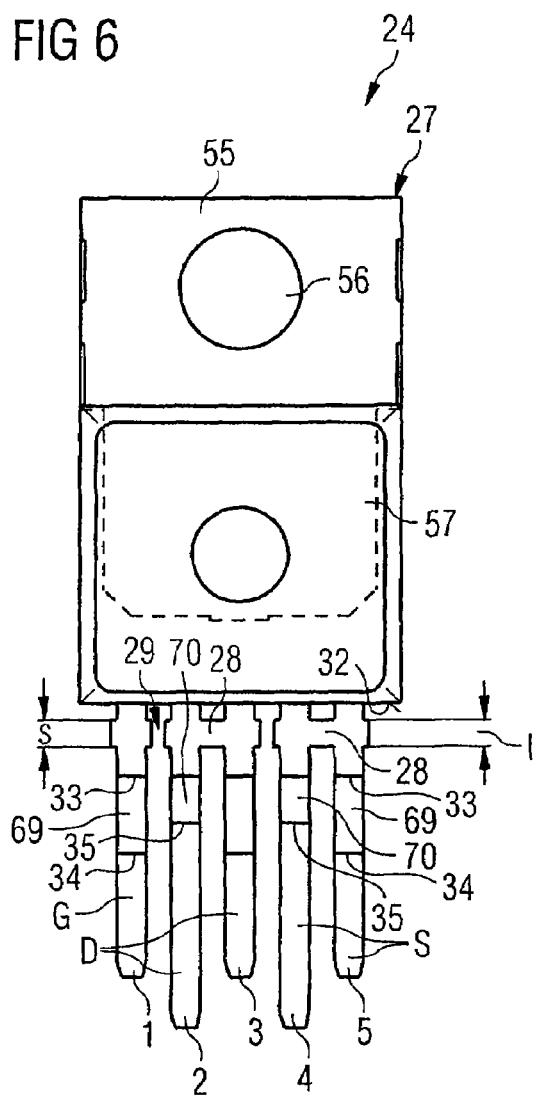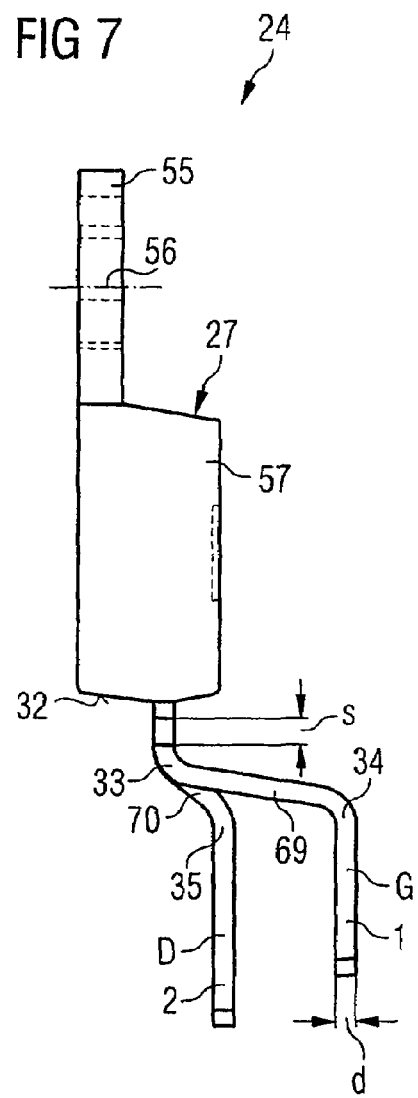

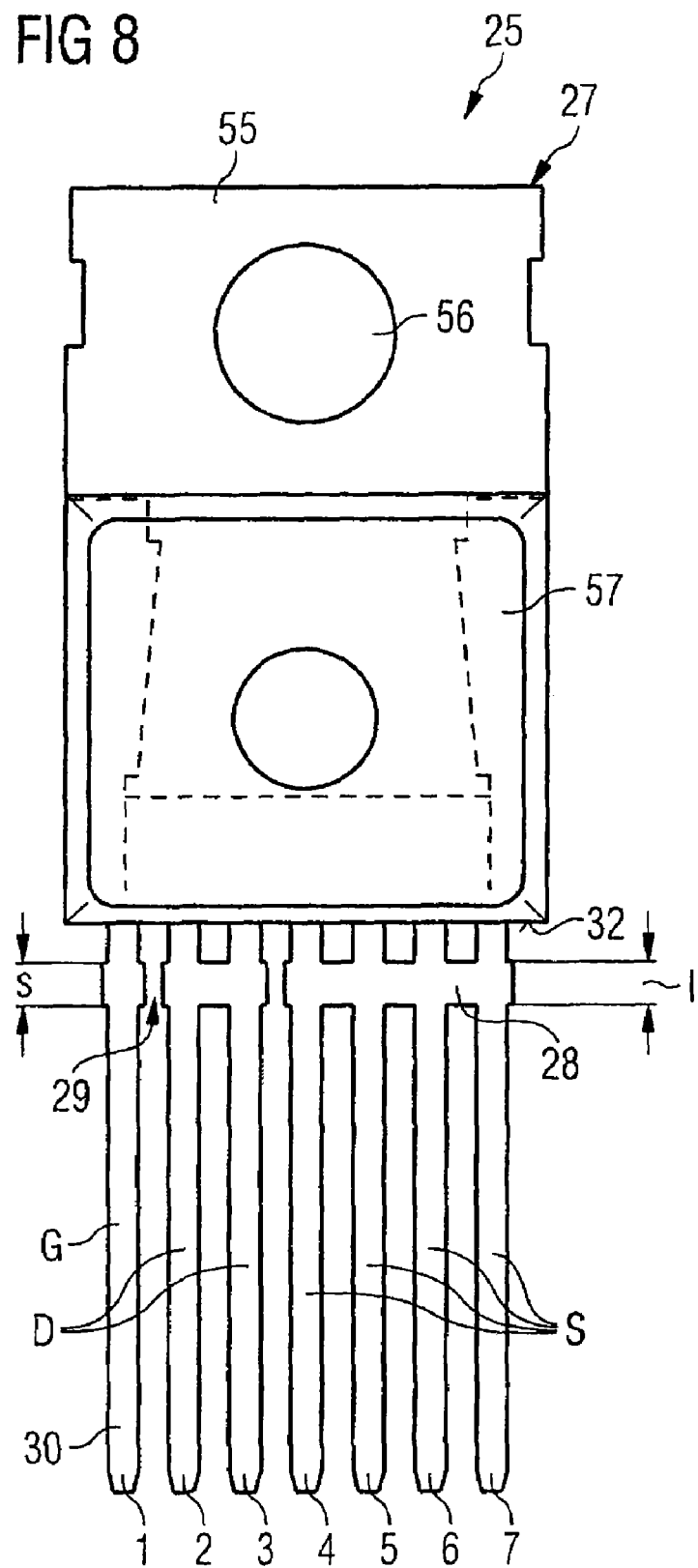

SEMICONDUCTOR COMPONENT IN A HOUSING WITH MECHANICALLY INFORCING FLAT CONDUCTOR WEBS

PRIORITY

This application claims priority from German Patent Application No. DE 10 2005 018 941.5, which was filed on Apr. 22, 2005, and is incorporated herein by reference in its entirety.

TECHNICAL FIELD

The invention relates to a semiconductor component, in particular a power semiconductor component, and a method for the production thereof.

BACKGROUND

The majority of electronic semiconductor components is produced in standard housings of this type with external leads for external bonding. These external leads or legs are subjected to high mechanical loads during the external bonding process and the operation of the semiconductor components, which are compensated by the geometry of the standard housings and by the anchorage of the external leads in the standard housing. If these loads are to great, the external leads can be torn out of the housing, whereupon the function of the semiconductor component as a whole can no longer be ensured. The external leads can further transmit high forces and moments into the interior of the housing, resulting in potential damage to the internal connecting elements and/or to the semiconductor chip located in the interior.

This problem can be solved by increasing the cross-section and thus the robustness of the external leads. This, however, has the disadvantage that the standardized assembly dimensions can no longer be met, making both the internal installation and the external mounting of semiconductor components more expensive. The changed connection geometry further results in higher forces and moments in components with custom-made offsets of the external leads. Such custom-made offsets are produced at a later date, with the result the reinforced cross-sections of the external leads exert increased moments on the restraint in the housing.

SUMMARY

The invention is based on the problem of creating a semiconductor component with a standard housing with a plurality of external leads in flat conductor technology, increasing the mechanical and electric capacity of the external leads without altering their cross-section and thus their geometry.

According to the invention, a semiconductor component is produced in a standard housing with a plurality of external leads in flat conductor technology. Between adjacent external leads for identical supply potentials or signals, mechanically reinforcing flat conductor webs electrically connecting the external leads are located within and/or outside the standard housing.

This semiconductor component offers the advantage that it enhances the robustness of the external leads by connecting a number of homopolar external leads by internal or external flat conductor webs. These external leads braced by flat conductor webs are more resistant against mechanical loading in operation and can nevertheless be processed using the steps in common use today, in particular because the standardized external lead geometry is maintained at the point where the external leads are used for external bonding.

In an embodiment of the invention, the flat conductor webs which mechanically connect adjacent homopolar external leads have the same material thickness as the external leads in flat conductor technology. This offers the advantage that the flat conductor webs do not have to be specially installed between adjacent external leads using adhesive force during the production of the flat conductor frame, but the copper sheet provided for the flat conductor frames can be used for the flat conductor webs as well. Only the punching tool used for producing the flat conductor frame from a copper sheet has to be adapted to the new design, which provides for flat conductor webs between the external leads.

The flat conductor webs can be provided within and/or outside the housing; in the former case, the external leads of the standard housing do not differ from those of the standardized housing, while in the latter case, it is obvious from the outside that flat conductor webs are additionally placed between the external leads.

In another embodiment of the invention, the longitudinal dimension of the flat conductor webs is increased relative to the longitudinal dimension of mechanical connecting webs between external flat conductors of a standard flat conductor frame. The term mechanical connecting webs describes the mechanical connection between individual external leads, which is provided in a flat conductor frame in order to maintain the precise geometrical arrangement of the external leads during the moulding process, these connecting webs being severed in a special punching step following the moulding and separation of individual semiconductor components. These connecting webs have a minimum longitudinal dimension which is just sufficient to hold the external leads in position during the moulding process. In adjacent homopolar external leads, it is therefore expedient to retain these existing connecting webs as flat conductor webs between the adjacent homopolar external leads and not to cut them out or sever them.

In this case, too, the special punching tool separating the semiconductor components and/or the external leads from one another has to be modified or adapted accordingly. This, however, involves less overall expenditure, because only individual punching lugs have to be removed from the tool. If, as described above, the longitudinal dimension of the flat conductor webs is increased relative to the existing mechanical connecting webs, the punching tool used to produce the flat conductor frame has to be modified. This modification of the punching tool likewise involves lower costs than a change to the standard for the standardized geometry of the external leads in flat conductor technology.

In a further embodiment of the invention, a plurality of flat conductor webs is provided between two external leads to be connected electrically. In this case, a bracing comprising a plurality of flat conductor webs is provided to improve the dimensional stability of the external leads or external flat conductors connected to one another by the flat conductor webs.

In an embodiment, each of the plurality of flat conductor webs extends directly between adjacently positioned external leads to be connected electrically. Each of the plurality of flat conductor webs may be of approximately the same length. The flat conductor webs may be positioned at intervals along the length of the external leads.

In this embodiment, the stability of the external leads is improved by a plurality of flat conductor webs of essentially the same dimensions which are positioned at intervals along the length of the flat conductor adjacent to the standard housing. The adjacently positioned external leads are, therefore, mechanically connected by a plurality of flat conductor webs of the same dimensions which extend perpendicularly between adjacently positioned side faces of the external leads. This arrangement provides a semiconductor component with bendable outermost portions of the external leads which are, at the same time, mechanically reinforced. The outermost portions of the external leads may, therefore, be bent to the desired position without damaging the internal electrical connections of the package. The degree of mechanical reinforcement provided to the external leads can be adjusted by selecting the number and/or breadth and spacing of the flat conductor webs which extend directly between adjacent external leads which are to be electrically connected.

The plurality of flat conductor webs may be positioned entirely within or entirely outside of the plastic housing. Alternatively, one or more of the plurality of flat conductor webs may be positioned within and one or more of the plurality of flat conductor webs may be positioned outside of the plastic housing. In each case, each of the flat conductor webs has essentially the same length and extends essentially perpendicularly between two adjacent external leads positioned adjacent one another. In a further embodiment, each of the plurality of flat conductor webs also has the same breadth and thickness.

In a further embodiment of the invention, no flat conductor webs are provided within the housing, but the flat conductor webs are located outside the standard housing at a distance from a plastic housing edge between adjacent homopolar external leads. This embodiment of the invention offers the advantage that this modification can always be seen from the outside without interfering with the standard housing, so that the assembly process can be monitored to avoid the application of different potentials to homopolar external leads connected by flat conductor webs during final assembly. By means of the geometry of the flat conductor webs, it is further possible to define and maintain a minimum distance between the semiconductor component housing and the board on which the semiconductor component is mounted. The flat conductor webs act as mounting stops in this context.

In a further preferred embodiment of the invention, the external leads have an offset at a distance from a plastic housing edge, the flat conductor webs being located adjacent to the plastic housing edge and maintaining a distance from the offset of the external leads. This offers the advantage that the external leads can be offset independent of the flat conductor webs and the flat conductor webs can still be designed in flat conductor technology.

In a preferred embodiment of the invention, the semiconductor component is a power semiconductor component with a MOSFET structure. The gate connection features a flat conductor as external lead, while the drain connection features at least two external leads electrically connected by a flat conductor web and the source connection also features at least two external leads electrically connected by a flat conductor web. This embodiment of the invention offers the advantage that both type T0 220-5 housings and type T0 220-7 standard housings can be used for MOSFET semiconductor components of this design.

For this purpose, the semiconductor component expediently incorporates a semiconductor chip with a power MOSFET, wherein a top side of the semiconductor chip features at least one large-area source contact completely covering the top side of the semiconductor chip apart from a gate contact surface. On the rear side opposite the top side, this power MOSFET features a drain contact surface located on a flat conductor island of the flat conductor frame. In order to connect the source contact surfaces and the gate contact surface to the external leads, the top side of the semi-conductor chip is provided with a plurality of bonding strips within the standard housing between the source contact and the flat conductors of the external source lead. The gate contact surface is connected to an external lead by a single bonding wire within the standard housing, because only signal currents flow through this bonding wire.

If a power MOSFET of this type is installed into a type T0 220-5 standard housing with external leads 1-5, the external leads 2 and 3 are preferably connected by a flat conductor web and the external leads 4 and 5 are likewise provided with an electrically connecting flat conductor web of this type. The single external lead 1 is reserved for the gate connection, while the connected external leads 2 and 3 form the common external drain contact and the external leads 4 and 5 the corresponding external source contact.

In a further preferred embodiment of the invention, a type T0 220-5 standard housing with three offset external leads 1, 3 and 5 and two slightly less offset external leads 2 and 4 is used. As the electrically connecting and mechanically stabilizing flat conductor webs are provided before the external leads are offset, the external leads can easily be offset in the manner described above at a later date to meet the requirements of individual customers. Instead of a standard housing with five external leads, a type T0 220-7 standard housing with seven external leads can be used for a semiconductor component of this design. The external leads 2 and 3 are preferably connected by a flat conductor web and form the external drain contact, while the external leads 4, 5, 6 and 7 are electrically coupled by a plurality of flat conductor webs and form the external source contact, with the external lead 1 being reserved for the gate contact.

The principle of the invention can, however, also be applied to semiconductor components in standard housings designed for integrated circuits with 10, 20, 50 or 100 external leads. In a preferred embodiment of the invention, a type P-DIP-20 standard housing with external leads 1-20 is used. The external leads 5 and 6 and the opposite external leads 15 and 16 are preferably connected by flat conductor webs. At both of these points, these additional flat conductor webs can very easily be integrated into the existing assembly, because this involves only a minor modification of the flat conductor punching process. At the same time, these flat conductor webs, if arranged symmetrically as in the above example, can act as spacers between the printed circuit board and the semiconductor component.

A method for the production of a semiconductor component in a standard housing with a plurality of external leads in flat conductor technology, wherein flat conductor webs mechanically reinforcing and electrically connecting the external leads are provided between adjacent external leads for identical supply potentials or signals, is characterized by the following step. Following the production of a plurality of semiconductor components in appropriate positions of a flat conductor frame, a punching tool is used to separate the semiconductor components, which removes the mechanical connecting webs normally provided between the external flat conductors only between those flat conductors which are not to be electrically connected to one another.

The advantage of this method is obvious, because, for separating the semiconductor components and the external leads, only the punching needles provided for adjacent homopolar leads have to be removed from the tool. By omitting these punching needles, the relevant external leads can be reinforced and enhanced in their current capacity, because the connecting webs are left.

In a further preferred execution of the method, a flat conductor frame with two-dimensionally enlarged flat conductor webs between flat conductors to be electrically connected to one another is prepared and punched. In this case, the separating punch does not have to be adapted, but rather the tool used to punch out the flat conductor frame from a flat conductor plate, such as a copper sheet. Enlarged mechanical flat conductor webs are in this case provided in positions intended to remain connected as external leads at the start of the production process.

BRIEF DESCRIPTION OF THE DRAWINGS

The invention is explained in greater detail below with reference to the accompanying Figures.

FIG. 3 is a diagrammatic top view of a section of a flat conductor frame with a mounted semiconductor chip and bonds for semiconductor components according to FIG. 1;

FIG. 4 is a diagrammatic top view of a semiconductor component according to a second embodiment of the invention;

FIG. 5 is a diagrammatic top view of a semiconductor component according to a third embodiment of the invention;

FIG. 6 is a diagrammatic top view of a semiconductor component according to a fourth embodiment of the invention;

FIG. 7 is diagrammatic side view of the semiconductor component according to FIG. 6;

FIG. 8 is a diagrammatic top view of a semiconductor component according to an embodiment of the invention;

DETAILED DESCRIPTION

Figure 1:
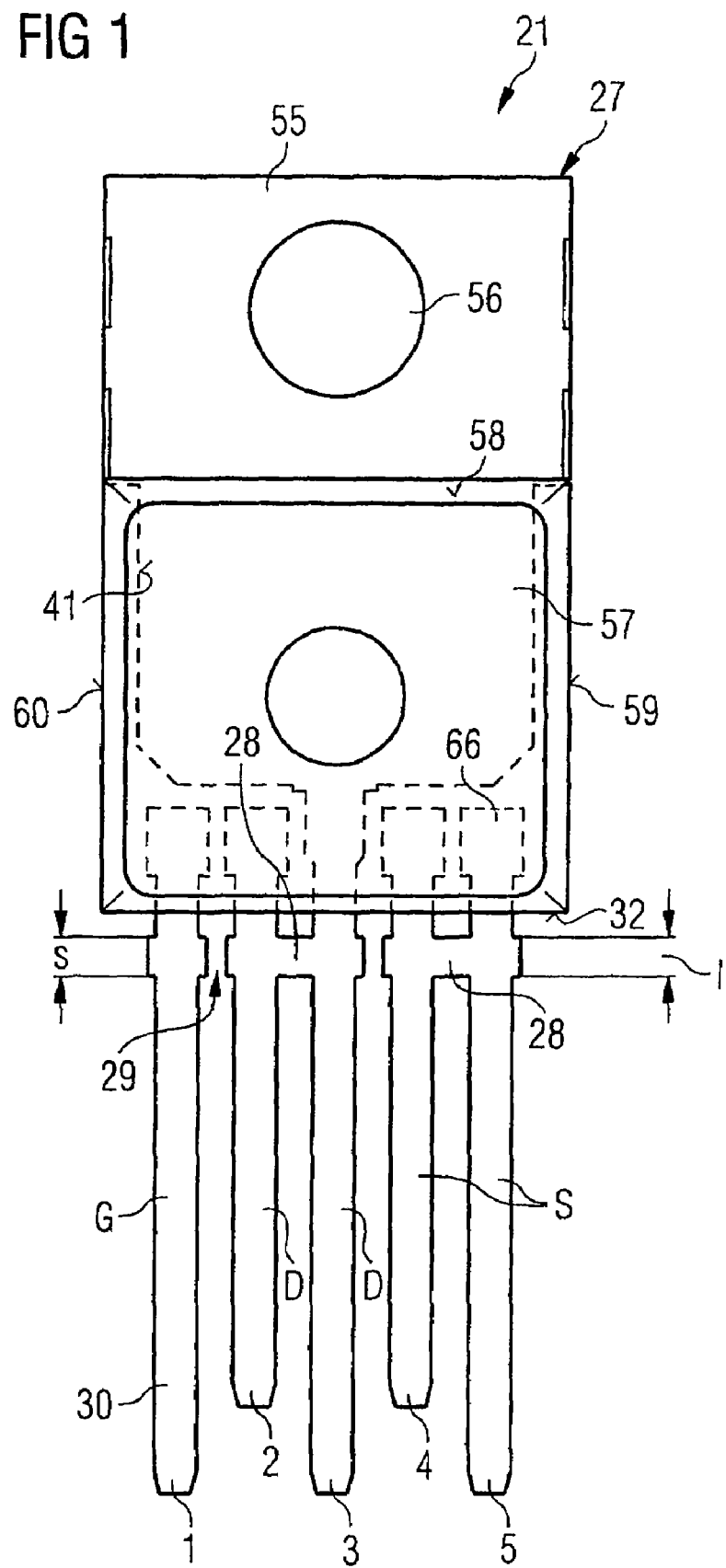
FIG. 1 is a diagrammatic top view of a semiconductor component according to a first embodiment of the invention.

FIG. 1 is a diagrammatic top view of a semiconductor component 21 according to a first embodiment of the invention. This semiconductor component 21 is a power semiconductor component in a type T0 220-5 standard housing. This standardized housing features a plastic housing body 57 with lateral edges 59 and 60, an upper edge 58 and a lower plastic housing edge 32. A cooling lug 55 with a thickness of approximately 1.25 mm and a cooling surface of approximately 10 mm×5 mm projects from the upper housing edge 58. In the centre of the cooling lug 55, there is a mounting hole 56 with a diameter of approximately 3.7 mm for attaching this power semiconductor component to a cooling or earth frame.

The cooling lug 55 projects into the plastic housing body 57 as indicated by a broken line and supports a flat conductor island 41 with a material thickness of approximately 0.5 mm, which projects with an external lead 3 from the lower housing edge 32, the external lead 3 and the flat conductor island 41 having the same material thickness and being punched out of a common flat conductor sheet, preferably a copper sheet. The remaining external leads 1, 2, 4 and 5 project from the lower plastic housing edge 32 independently, i.e. electrically isolated from the external lead 3, the external leads 2 and 4 being shorter than the external leads 1, 3 and 5.

The finished power semiconductor component 21 as illustrated in the top view of FIG. 1 features a severed connecting web with a length s between the external leads 1 and 2 and a severed connecting web with a length s between the external leads 3 and 4. In contrast, the connecting webs between the external leads 2 and 3 and between the external leads 4 and 5 are not punched out and severed, leaving flat conductor webs 28 electrically and mechanically connecting the external leads 2 and 3 or 4 and 5 respectively. The flat conductor webs 28 extend between the neighboring external leads 2 and 3 and 4 and 5 respectively and are positioned outside of the plastic housing body 57. In this embodiment of FIG. 1, the longitudinal dimension 1 of the flat conductor webs precisely equals the longitudinal dimension s of the severed mechanical connecting webs 29.

As a result, the external leads 2 and 3 are mechanically reinforced in spite of the thin flat conductor material of 0.5 mm, and on the other hand, the current-carrying capacity of these leads is increased, because they can now cope with twice the original electrical load. In view of this, the single external lead 1 is assigned to the gate connection G, while the external leads 2 and 3 connected by a flat conductor web 28 form the drain connection. The external lead 2 is mechanically connected to the external lead 3 and to drain potential only by the flat conductor web 28. Only one of the two external drain leads 2, 3 extends from the flat conductor island 41. The external leads 4 and 5 are likewise connected by a flat conductor web 28 and form the source connection for the electronic power semiconductor component 21. The plastic body 57 covers an area of approximately 10 mm×9 mm and has a thickness of approximately 4.3 mm.

Figure 2:
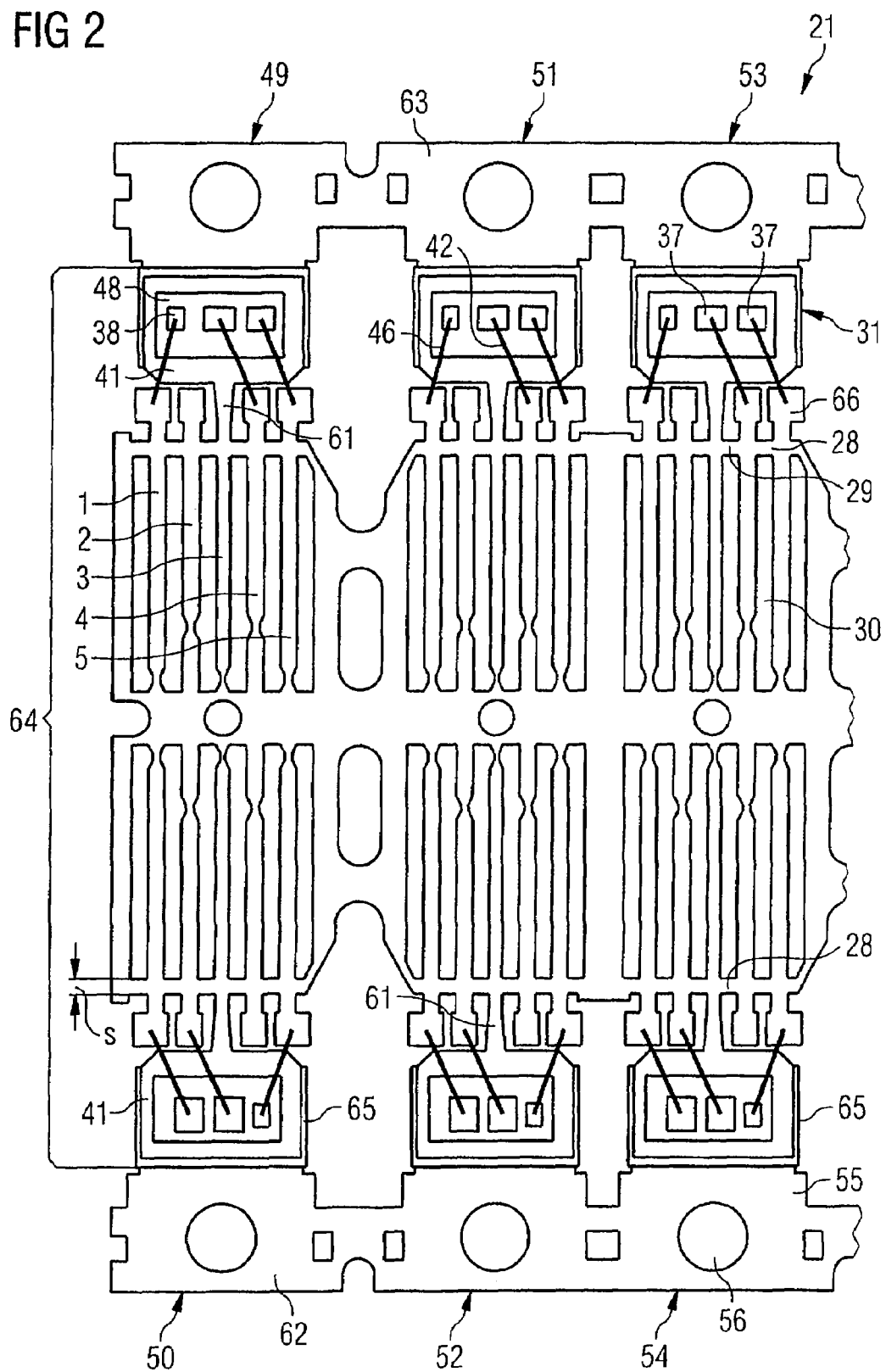
FIG. 2 is a diagrammatic top view of a section of a flat conductor frame with six semiconductor component positions for semiconductor components according to FIG. 1.

FIG. 2 is a diagrammatic top view of a section of a flat conductor frame 31 with six semiconductor component positions 49-54 for semiconductor components 21 according to FIG. 1. In each of the component positions 49-54, the external leads 1, 2, 3, 4 and 5 are pre-punched and mechanically connected to one another by connecting webs 29, the central external lead 3 being additionally connected to the flat conductor island 41 by a supply web 61 in each of the component positions 49-54 and holding the flat conductor island 41 in position. While the flat conductors 30 of the external leads 1, 2, 3, 4 and 5 are punched out from a copper sheet with a thickness of approximately 0.5 mm, the flat conductor frame 31 is provided with two cooling strips 62 and 63, between which the flat conductor structure 64 is mounted. The flat conductor islands 41 of the semiconductor component positions 49-54 are joined to the cooling strips 62 and 63 by means of a joining seam 65. The cooling strips 62 and 63 and the cooling lugs 55 have a thickness of approximately 1.3 mm.

In this top view of a section of a flat conductor frame 31, semiconductor chips 48 in the form of MOSFET silicon chips have already been mounted on the flat conductor islands 41 in the semiconductor component positions 49-54. These MOSFETs feature a gate contact surface 38 and source contacts 37 on their top side and a large-area drain contact on their underside, which is electrically connected to the semiconductor island 41. The drain contact is therefore automatically connected to the external lead 3 by the supply web 61. In order to connect the gate and source contact surfaces on the top side 36 of the semiconductor chip 48 to corresponding inner contact surfaces 66, the bonds between the contact surfaces 37 and 38 respectively extend to the contact surfaces 66. This bonding structure is explained with reference to FIG. 3.

FIG. 3 is a diagrammatic top view of a section of a flat conductor frame 31 with a mounted semiconductor chip 48 and bonds 42-46. This section shows only one semiconductor component position 49 of the flat conductor frame 31. In this illustration, only that section of the cooling strip 63 which overlaps the flat conductor island 41 I shown. The flat conductor island 41 already supports a semiconductor chip 48 with a top side 36, on which two large-area source contacts 37 are shown, which occupy nearly the whole top side 36, leaving only a small gate contact surface 38 for the control of the MOSFET.

The entire rear side 39 of the semiconductor chip 48 is occupied by a drain contact surface 40, whereby the semiconductor chip 48 is conductively attached to the flat conductor island 41. As the flat conductor island 41 is directly connected to the external lead 3 via the supply web 61, this external lead 3 simultaneously acts as the drain connection D.

The drain connection D is reinforced by the external lead 2 via the flat conductor web 28, which initially only holds the external lead in position mechanically during the moulding process, but is not severed later following the production of the semi-conductor component in the semiconductor component position 49, as indicated by the broken lines for the connecting web 29 between the external leads 1 and 2. This connecting web 29 with a length s is severed by a punching tool after the semiconductor chip 48 with the bonds 42-46 and the contact surfaces 66 has been embedded into a moulding compound. The external lead 2 provides a second drain lead which is separate from the flat conductor island 41 and connected only by a flat conductor web 28 extending directly between the external lead 2 and the neighboring lead 3. The flat conductor webs 28 are positioned at a point along the length of the external leads which remains outside of the plastic housing of the semiconductor component.

In this embodiment according to FIG. 3, the flat conductor webs 28 remaining between the external leads 2 and 3 or 4 and 5 respectively have the same longitudinal dimension l as the longitudinal dimension s of the connecting web 29. The bonding elements 42-45 can be designed either as bonding wires of suitable thickness or as bonding strips. For the gate connection, a thin bonding wire 46 with a diameter of approximately 20 μm is sufficient, while the aluminium bonding wires representing the bonding elements 42-45 have a diameter of 50 μm to 600 μm. If the bonding elements 42-45 are designed as bonding strips, one bonding strip for each contact surface 66 of the source connections 4 and 5 respectively is sufficient.

FIG. 4 is a diagrammatic top view of a semiconductor component 22 of a second embodiment of the invention. The internal structure of this embodiment of the invention corresponds to that explained with reference to FIGS. 1 to 3. The housing is a type P-T0 220-5 standard housing. The external leads 1-5 are not offset, but project in a parallel arrangement from the plastic housing edge 32, the longitudinal dimension s of the severed connecting webs 29 being significantly smaller than the longitudinal dimension 1 of the flat conductor webs 28 between the external leads 2 and 3 or 4 and 5 respectively. These larger-area flat conductor webs 28 offer higher mechanical strength and greater robustness when subjected to loads during assembly at the customer's premises or in the final assembly process, for example when punching individual semiconductor components 22 from the semiconductor component positions of a flat conductor frame. Such extended flat conductor webs 28, however, have to be taken into account when punching out the flat conductor structure 64 shown in FIG. 2 and should not be soldered as bridges across the external leads 2 and 3 or 4 and 5 respectively at a later stage to save money.

FIG. 5 is a diagrammatic top view of a semiconductor component 23 of a third embodiment of the invention. This embodiment of the invention implements a further design variant for the flat conductor webs 28, wherein the longitudinal dimension 1 of these flat conductor webs between the external leads 2 and 3 or 4 and 5 respectively is three times the longitudinal dimension s of the connecting webs 29, which have meanwhile been mechanically severed. The external leads 2 and 3 are, therefore, physically connected by a plurality of three flat conductor webs 28 which each have the same length, breadth and thickness and extend between the two adjacently facing long sides of the external leads 2 and 3. Similarly, three flat conductor webs 28 spaced at intervals along the length of the external leads 4 and 5 are provided which extend between external leads 4 and 5. Each of the flat conductor webs 28 has the same length and is positioned outside of the plastic housing of the semiconductor component. The outermost portions of the external leads are, therefore, easily bendable without causing damage to the internal electrical connections of the semiconductor component. The semiconductor component may, therefore, be more reliably mounted on a higher-level circuit board. The lower edge 68 of the flat conductor webs 28 acts as an insertion stop up to which the external leads 1, 2, 3, 4 and 5 can be inserted into suitable connectors.

FIG. 6 is a diagrammatic top view of a semiconductor component 24 of a fourth embodiment of the invention. This semiconductor component 24 is a power semiconductor component accommodated in a type P-T0 220-5 standard housing. In this fourth embodiment of the invention, too, the internal structure of the power semiconductor component 24 is identical to that of the earlier embodiments. The external leads 1, 2, 3, 4 and 5, however, feature offsets 33, 34 and 35. The first offset 33 is located at the same distance from the plastic housing edge 32 for all five external leads. The second offset 34 of the external leads 1, 3 and 5 differs from the second offset 35 of the external leads 2 and 4 insofar as the offset leg 69 of the external leads 1, 3 and 5 is longer than the offset leg 70 of the external leads 2 and 4, resulting in the side view shown in FIG. 7.

FIG. 7 is a diagrammatic side view of the semiconductor component 24 according to FIG. 6. While the cooling lugs 55 with a thickness of approximately 2.5 mm feature the mounting hole 56 as shown in the previous Figures, and while the plastic housing body 57 has the same dimensions as in the previous Figures, the originally straight external leads 1-5 are offset in this embodiment of the invention, offset legs 69 and 70 of different lengths ensuring a three-dimensional spacing of the offset external leads. As the flat conductor webs 28 connecting the external source contacts S and the external drain contacts D are located in front of the offsets 33-35, they can be produced by not severing some connecting webs when punching the semiconductor components 24 out from a suitable flat conductor frame not shown in the drawing. In this embodiment of the invention, the longitudinal dimension 1 of the flat conductor webs 28 precisely equals the longitudinal dimension s of the connecting webs 29.

FIG. 8 is a diagrammatic top view of a semiconductor component 25 of a fifth embodiment of the invention. In this case, the power semiconductor component is accommodated in a type P-T0 220-5 standard housing with seven external leads identified by reference numbers 1 to 7. This housing type likewise features a cooling lug 55 with approximately the same dimensions as the previously described examples and a mounting hole 56 for securing the power semiconductor component 25. The external dimensions of the plastic housing body 57 remain the same as well, but seven external leads 1-7 as mentioned above project from the plastic housing edge 32. In this embodiment of the invention, the gate connection G is located on the external lead 1, the drain connection D is represented by the external leads 2 and 3, and the source connection S by the external leads 4, 5, 6 and 7, which are connected to one another and stabilized by three flat conductor webs 28. This represents an asymmetrical distribution of the live external leads 2 and 3 or 4-7 respectively, but symmetrical arrangements wherein the drain contact D incorporates the external leads 2, 3 and 4 and the source contact S is represented by the external leads 5, 6 and 7 are also conceivable.

Figure 9:
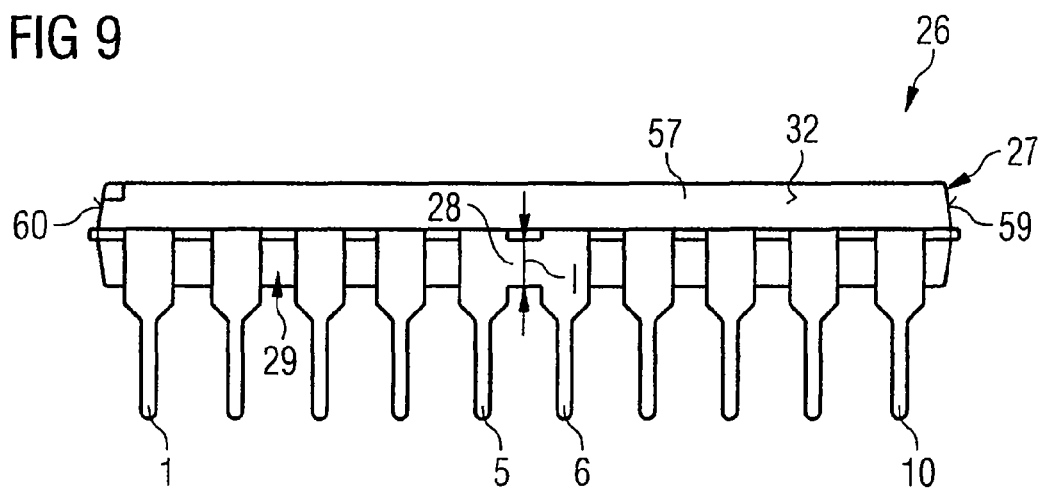
FIG. 9 is a diagrammatic side view of a semiconductor component according to a sixth embodiment of the invention.
Figure 10:
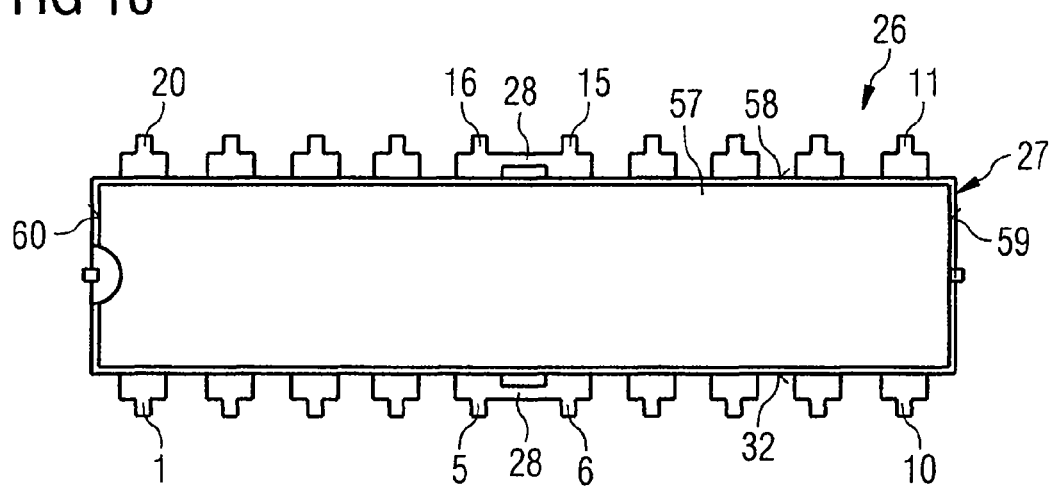
FIG. 10 is diagrammatic top view of the semiconductor component according to FIG. 9.

The principle of the invention is, however, not restricted to power semiconductor components, but can be applied to other housing types as illustrated in FIGS. 9 and 10 below.

FIG. 9 is a diagrammatic side view of a semiconductor component 26 according to a sixth embodiment of the invention. This embodiment of the invention uses a type P-DIP-20 housing, wherein FIG. 9 shows that, of the external leads 1-10 projecting from a plastic housing edge 32, leads 5 and 6 are mechanically and electrically connected by a flat conductor web 28, which necessitates identical potentials. The lateral edges 59 and 60 of the plastic housing body 57 do not feature any external leads, but the top view illustrates that this housing type features a total of 20 external leads.

FIG. 10 is a diagrammatic top view of the semiconductor component 26 according to FIG. 9. This top view shows 20 external leads 1-20, the external leads 5 and 6 being electrically connected by a flat conductor web 28 as explained above. In addition, the external leads 15 and 16 on the upper edge 58 of the plastic housing body 57 are also mechanically and electrically connected by a flat conductor web 28 of this type. Here, too, the connected external leads 15 and 16 have to be connected to the same signal or supply potential. The advantage of this arrangement lies in the fact that it is possible to check from the outside which external leads 1-20 are coupled, which simplifies the testing of the correct application of this semiconductor component.

LIST OF REFERENCE NUMBERS

1-20 External lead 1-5
21 Power semiconductor component (embodiment 1)
22 Power semiconductor component (embodiment 2)
23 Power semiconductor component (embodiment 3)
24 Power semiconductor component (embodiment 4)
25 Power semiconductor component (embodiment 5)
26 Power semiconductor component (embodiment 6)
27 Standard housing
28 Flat conductor web
29 Connecting web (mechanical)
30 External flat conductor
31 Standard flat conductor frame or flat conductor frame
32 Plastic housing edge
33 Offset
34 Offset
35 Offset
36 Top side of the semiconductor chip
37 Source contact
38 Gate contact surface
39 Rear side of the semiconductor chip
40 Drain contact surface
41 Flat conductor island
42 Bonding element
43 Bonding element
44 Bonding element
45 Bonding element
46 Bonding wire
47 Semiconductor component position
48 Semiconductor chip
49-54 Semiconductor component position
55 Cooling lug or surface
56 Mounting hole
57 Plastic housing body
58 Upper edge
59 Lateral edge
60 Lateral edge
61 Supply web
62 Cooling strip
63 Cooling strip
64 Flat conductor structure
65 Joining seam
66 Internal contact surfaces
67 Broken line
68 Lower edge
69 Offset leg
70 Offset leg
d Material thickness of flat conductors
D Drain connection
G Gate connection
S Source connection
s Longitudinal dimension of connecting webs
l Longitudinal dimensions of flat conductor webs

What is claimed is:

1. A semiconductor component, comprising a housing with a plurality of external leads in flat conductor technology, wherein between a first pair of adjacent ones of the external leads that, during operation of the semiconductor component, are at identical potentials, a mechanically reinforcing first flat conductor web electrically connecting together the first pair of external leads during the operation of the semiconductor component is located outside the housing such that distal ends of the first pair of external leads extend from the first flat conductor web and remain spaced apart from each other.

2. The semiconductor component according to claim 1, wherein the first flat conductor web has the same material thickness as the external leads in flat conductor technology.

3. The semiconductor component according to claim 1, wherein a longitudinal dimension of the first flat conductor web is larger than a longitudinal dimension of mechanical a connecting web between external flat conductors of a flat conductor frame.

4. The semiconductor component according to claim 1, wherein the first flat conductor web is located outside the housing at a distance from the housing edge between the first pair of external leads.

5. The semiconductor component according to claim 1, wherein the semiconductor component comprises a power MOSFET with a gate connection with a flat conductor, a drain connection to which the first pair of external leads is electrically connected, and a source connection to which a second pair of adjacent ones of the external leads is connected, a second flat conductor web electrically connecting the second pair of external leads together during the operation of the semiconductor component.

6. The semiconductor component according to claim 1, wherein the semiconductor component incorporates a semiconductor chip with a power MOSFET, wherein a top side of the semiconductor chip comprises at least one large-area source contact completely covering the top side apart from a gate contact surface, wherein a rear side opposite the top side is a drain contact surface located on a flat conductor island, and wherein a plurality of bonding strips within the housing connects the source contact to external flat conductors of the source contact.

7. A semiconductor component in a housing with a plurality of external leads in flat conductor technology, wherein between adjacent pairs of the external leads carrying identical potentials during operation of the semiconductor component, mechanically reinforcing flat conductor webs electrically connecting the external leads are located within the housing such that distal ends of the adjacent pairs of the external leads extend from the respective flat conductor webs and remain separated from each other.

8. The semiconductor component according to claim 7, wherein the flat conductor webs have a same material thickness as the external leads in flat conductor technology.

9. The semiconductor component according to claim 7, wherein a longitudinal dimension of the flat conductor webs is larger than a longitudinal dimension of mechanical connecting webs between external flat conductors of a flat conductor frame.

10. A semiconductor component, comprising:
a housing;
a first pair of flat leads protruding from the housing, each of the first pair of flat leads being at a same potential during operation of the semiconductor component;
a first flat conductor web disposed outside the housing and electrically connecting together the first pair of flat leads during the operation of the semiconductor component such that the first pair of flat leads protrude from the first flat conductor web.

11. The semiconductor component of claim 10, further comprising:
a second pair of flat leads protruding from the housing, each of the second pair of flat leads being at a same potential during the operation of the semiconductor component; and
a second flat conductor web disposed outside the housing and electrically connecting together the second pair of flat leads during the operation of the semiconductor component.

12. The semiconductor component of claim 11, wherein the semiconductor component comprises a MOSFET having a source and a drain, the first pair of flat leads are electrically coupled to the source, and the second pair of flat leads are electrically coupled to the drain.

* * * * *